(12) United States Patent
Min et al.

(10) Patent No.: US 6,450,839 B1
(45) Date of Patent: *Sep. 17, 2002

(54) SOCKET, CIRCUIT BOARD, AND SUB-CIRCUIT BOARD FOR SEMICONDUCTOR INTEGRATED CIRCUIT DEVICE

(75) Inventors: Byoung Jun Min; Hyo Geun Chae; Sang Young Choi, all of Asan (KR)

(73) Assignee: Samsung Electronics Co., Ltd. (KR)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/159,819

(22) Filed: Sep. 23, 1998

(30) Foreign Application Priority Data

Mar. 3, 1998 (KR) .............................. 98-3014

(51) Int. Cl.$^7$ ................................ H01R 13/42
(52) U.S. Cl. .................... 439/751; 439/70; 439/82
(58) Field of Search .................. 439/266, 260, 439/751, 82, 84, 746, 872, 83

(56) References Cited

U.S. PATENT DOCUMENTS

| | | | | |
|---|---|---|---|---|
| 3,264,597 A | * | 8/1966 | Gammel, Sr. | 439/80 |
| 3,634,819 A | * | 1/1972 | Evans | 439/825 |
| 3,717,841 A | * | 2/1973 | Mancini | 439/842 |
| 3,880,493 A | * | 4/1975 | Lockhart, Jr. | 439/525 |
| 3,924,921 A | * | 12/1975 | Feightner | 439/732 |
| 3,958,859 A | * | 5/1976 | Schmid | 439/746 |
| 4,217,024 A | * | 8/1980 | Aldridge et al. | 439/381 |
| 4,362,353 A | * | 12/1982 | Cobaugh et al. | 439/825 |
| 4,655,537 A | * | 4/1987 | Andrews | 439/70 |
| 4,715,823 A | * | 12/1987 | Ezura et al. | 439/267 |
| 5,160,270 A | * | 11/1992 | Reymond | 439/70 |
| 5,186,634 A | * | 2/1993 | Thompson | 439/82 |
| 6,213,817 B1 | * | 4/2001 | Jeong et al. | 439/751 |

FOREIGN PATENT DOCUMENTS

DE     2806683 A   *  8/1979   .......... H05K/7/10

* cited by examiner

*Primary Examiner*—Brian Sircus
*Assistant Examiner*—Son V. Nguyen
(74) *Attorney, Agent, or Firm*—Skjerven Morrill LLP

(57) ABSTRACT

An embodiment of the present invention provides a circuit board and a socket having mechanical connector for easily connecting and disconnecting a semiconductor integrated circuit device to and from the circuit board. Another embodiment further includes a sub-circuit board for electrically connecting the socket to the circuit board. The socket includes a socket body and a number of socket leads. The socket leads are shaped to compress elastically when inserted in a hole and thereby make contact between the socket leads and inner walls of the holes of the circuit board. The sub-circuit board has connection leads, which make contacts with the through holes of the circuit board in the same manner as the socket leads of the present invention.

39 Claims, 7 Drawing Sheets

SOCKET, CIRCUIT BOARD, AND SUB-CIRCUIT BOARD FOR SEMICONDUCTOR INTEGRATED CIRCUIT DEVICE

BACKGROUND OF THE INVENTION

1. Field of the Invention

The present invention generally relates to a socket, a circuit board, and a sub-circuit board for a semiconductor integrated circuit device, and more particularly to structures and methods for connection and disconnection of the socket, the sub-circuit board, and the circuit board.

2. Description of the Related Arts

Semiconductor integrated circuit (IC) devices are tested by various methods in order to verify their reliability. These tests include an electrical characteristics test and a burn-in test. The electrical characteristics test determines whether the characteristics of a semiconductor IC fall within the specifications of the IC, and the burn-in test applies temperature, voltage, and/or operating signals that are beyond the normal operating levels, to a semiconductor IC to detect latent defects which might appear at an early stage of regular use of the IC.

Generally, in testing, a semiconductor IC is placed in a socket that is fixed on a test circuit board that transfers electrical signals between the semiconductor IC and a tester. FIG. 1 through FIG. 3 are cross-sectional views showing three conventional methods for connecting a semiconductor IC 20 to a socket 70 and a test circuit board 80.

FIG. 1 shows a method for electrically connecting socket 70 and test circuit board 80. This method is mainly employed in Burn-In Test. For connection between socket 70 and test circuit board 80, connection leads 75 of socket 70 are inserted into through-holes 82 of test circuit board 80, and fixed by a soldering.

The connection method of FIG. 1 has a number of drawbacks. In particular, due to the use of solder 66, the connection method of FIG. 1 may cause lead poisoning of worker. In addition, when either socket 70 or test circuit board 80 is defective, separating socket 70 from test circuit board 80 for replacement of the defective component is difficult. In particular, the separation process includes heating test circuit board 80 to melt solder 66, and the heating may damage the wiring patterns (not shown) of test circuit board 80. Further, extended use of socket 70 and test circuit board 80 degrades the integrity of the bond created by solder 66, and the connection between socket 70 and test circuit board 80 becomes weak. This weakened connection can cause invalid test results.

The connection method of FIG. 2 between socket 70 and a test circuit board 100 is mainly employed in test handlers for electrical characteristics test. In this method, a receptacle 87 serves as an intermediate connection medium between socket 70 and test circuit board 100. Receptacle 87 is inserted into through hole 102 in test circuit board 100 and fixed by soldering. Then, connection leads 75 of socket 70 are inserted into respective receptacles 87. Separation of socket 70 from test circuit board is relatively easy because connection leads 75 make only temporary contacts with receptacles 87. However, the method in FIG. 2 has a number of disadvantages. First, to insert connection leads 75 into receptacles 85, external forces must be applied. Second, when connection leads 75 are fine-pitched, the method in FIG. 2 has a higher probability of short circuits and/or current leakage between neighboring through holes 102 than the method in FIG. 1 because the diameter of the through holes 102 is greater than that of through holes 82. In particular, each hole 102 must be wide enough to contain a receptacle 87, and thereby the distance between neighboring through holes 102 is relatively small. Third, adding and installing receptacles 87 increase the cost of IC tests.

To avoid the short circuits between neighboring through holes 102 in FIG. 2, a sub-circuit board 90 can be interposed between a socket 50 and test circuit board 100, as shown in FIG. 3. Sub-circuit board 90 has socket 50 thereon, and wiring patterns in sub-circuit board 90 electrically connect the connection leads (not shown) of socket 50 to respective through holes 92 of sub-circuit board 90. Connection pins 95 and receptacles 87 are respectively fixed to through holes 92 and through holes 102 by soldering. Then, connection pins 95 of sub-circuit board 90 are inserted into respective receptacles 87. However, even though sub-circuit board 90 can reduce or eliminate the short circuit problem, the connection method still has high test cost due to the additional components such as receptacles 87.

SUMMARY OF THE INVENTION

An embodiment of the present invention provides a socket and a circuit board, with or without a sub-circuit board for semiconductor integrated circuit device. The structure of each component in this invention provides convenient connection and disconnection of the socket or the sub-circuit board to and from the circuit board and low test cost by eliminating the use of solder and receptacles in the circuit board.

In accordance with an aspect of the present invention, the socket has distinctively shaped socket leads that are easily inserted into the through holes of circuit board. In addition, shape-induced elasticity of the socket leads provides a solid contact between the socket leads and the inner wall of the through holes.

The circuit board includes through holes where the socket leads are inserted, and the inner wall of the through holes are plated with conductive abrasion-resistant materials. Respective through holes are connected to a tester by wirings of the circuit board.

The sub-circuit board provides a connection between a socket, especially for fine-pitch semiconductor IC packages, and a circuit board. The sub-circuit board comprises through holes, wiring patterns which electrically connect the socket to the through holes, and connection leads. An end of each connection lead is fixed to the through holes, and the other end of the connection lead has a distinctive shape in the same manner as in the socket leads according to the present invention.

Moreover, the elasticity given to the socket leads and the connection leads of sub-circuit board extends the life of the socket and the sub-circuit board, since the socket leads and the connection pins recover their shape as soon as they are pulled out from the through holes of the circuit board.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and, in which.

DETAILED DESCRIPTION OF THE PREFERRED EMBODIMENTS

Embodiments of the present invention will be described below with reference to the accompanying drawings.

Figure 1:
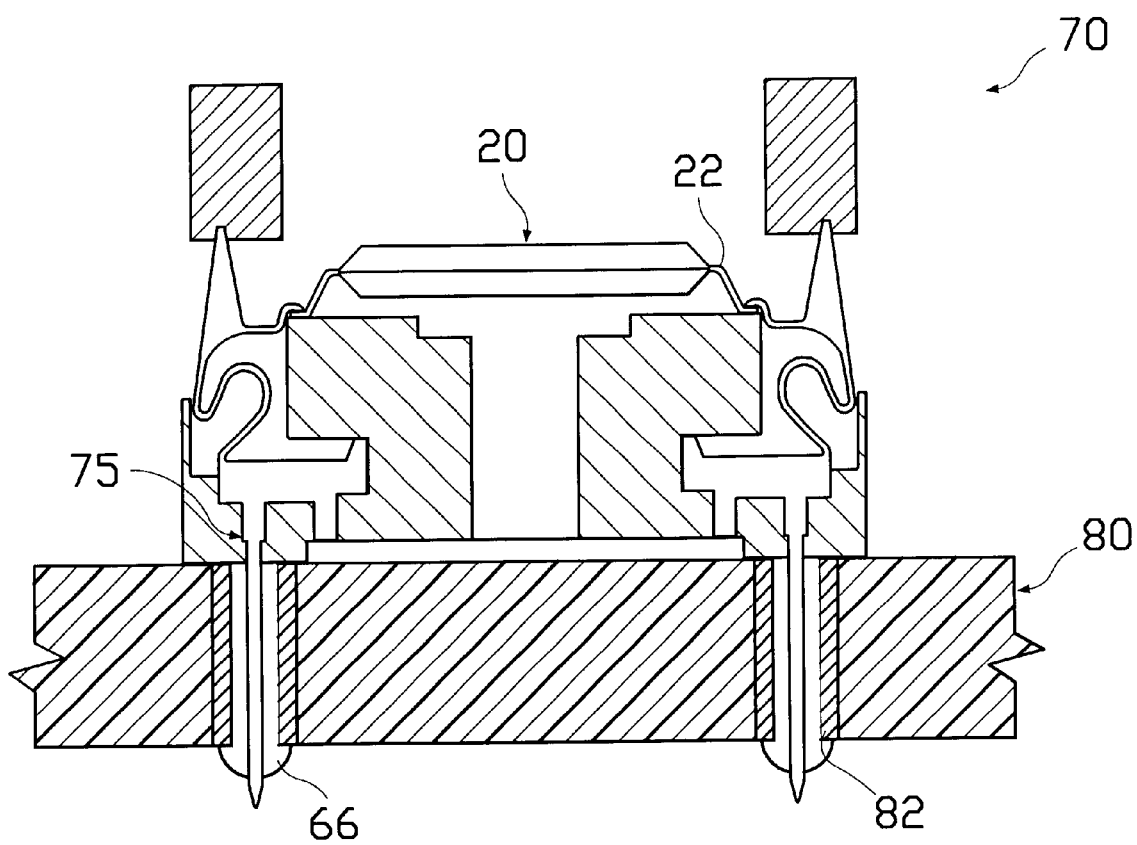
FIG. 1 is a cross-sectional view showing a conventional connection method between a socket and a circuit board for testing a semiconductor integrated circuit device.
Figure 2:
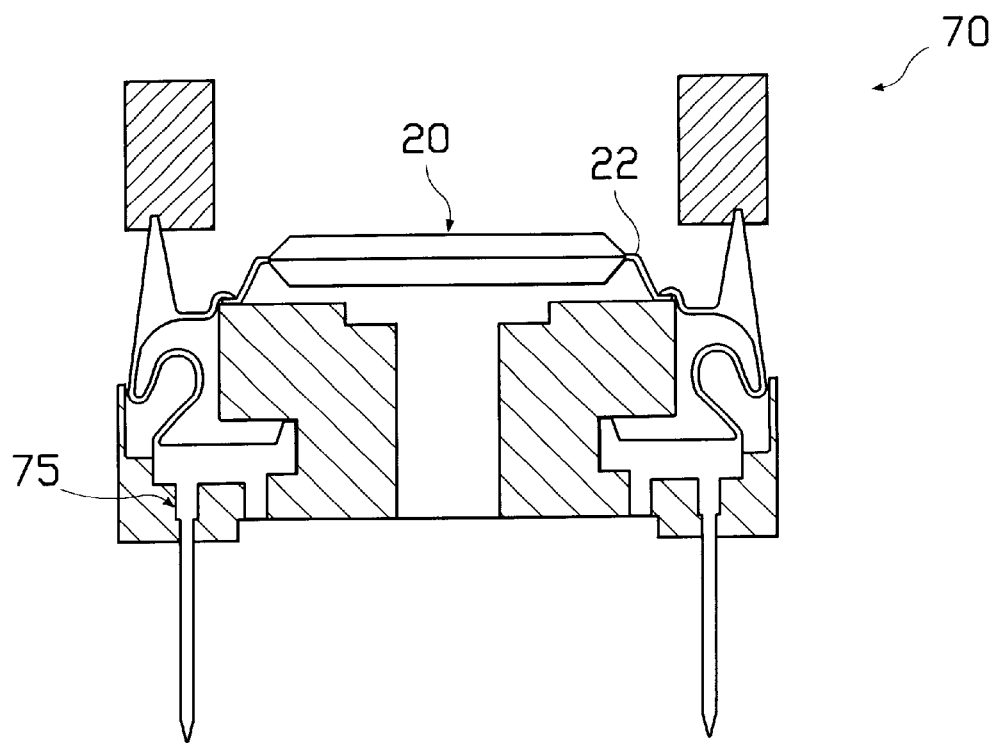
FIG. 2 is a cross-sectional view showing another conventional connection method between the socket and the circuit board for testing the semiconductor integrated circuit device.
Figure 2:
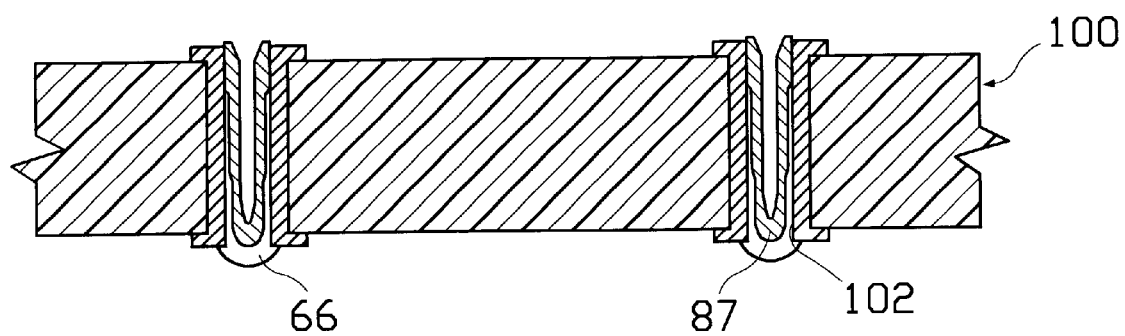
Figure 3:
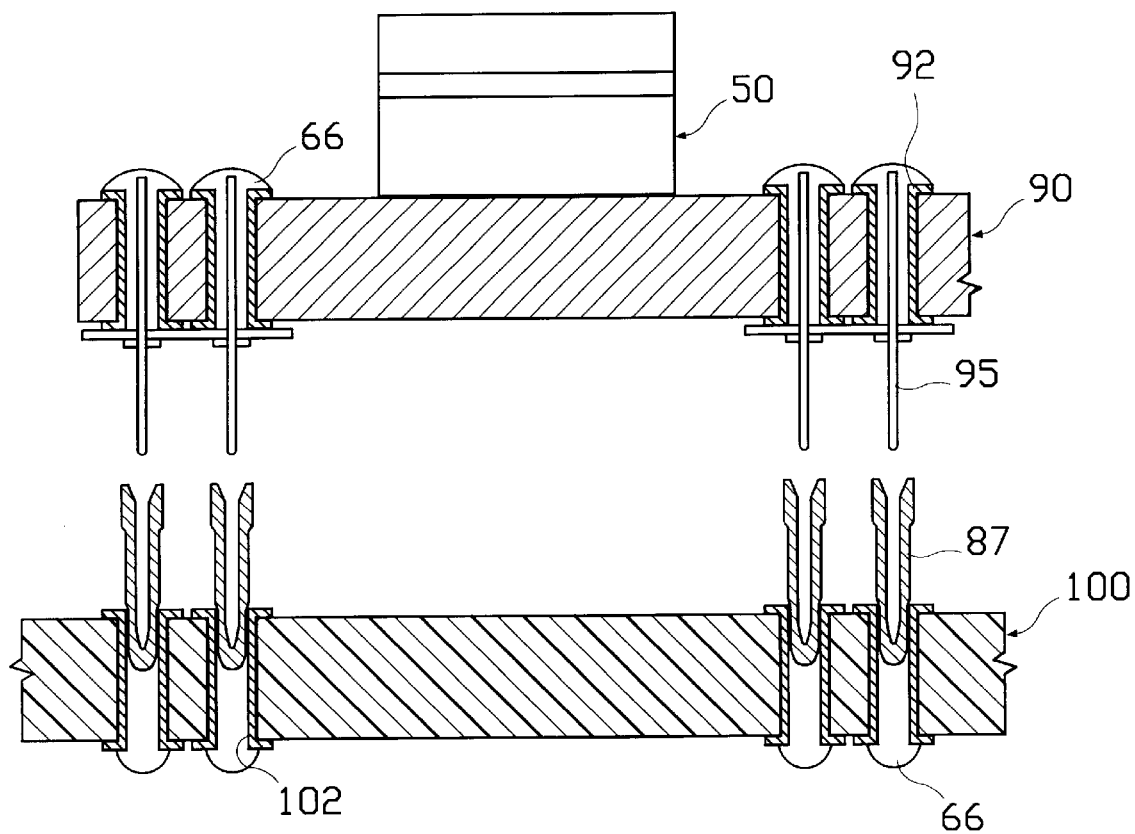
FIG. 3 is a cross-sectional view showing still another conventional connection method between the socket and the circuit board for testing the semiconductor integrated circuit device.
Figure 4:
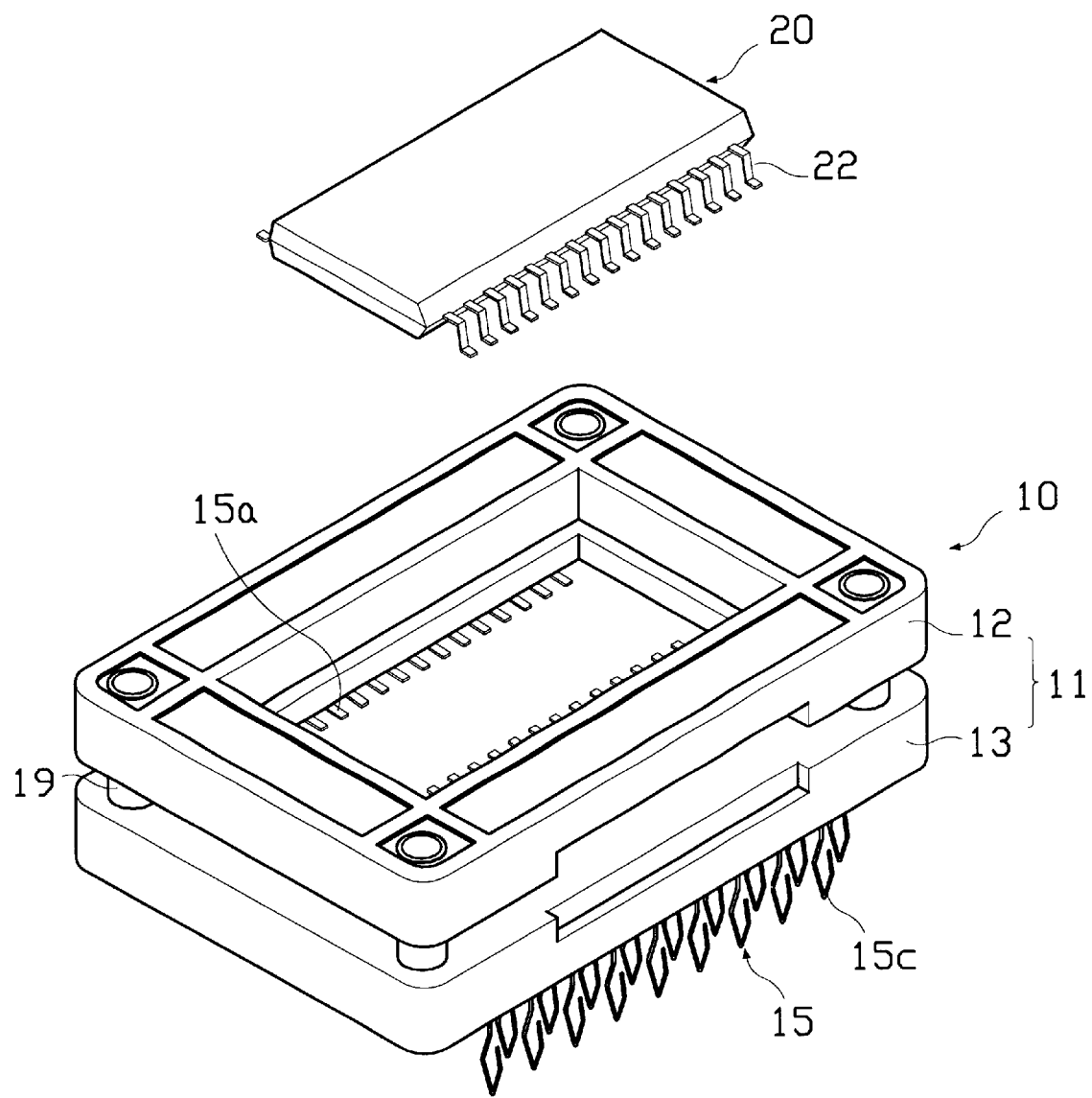
FIG. 4 is a perspective view showing an embodiment of a socket for testing a semiconductor integrated circuit device according to the present invention.
Figure 5:
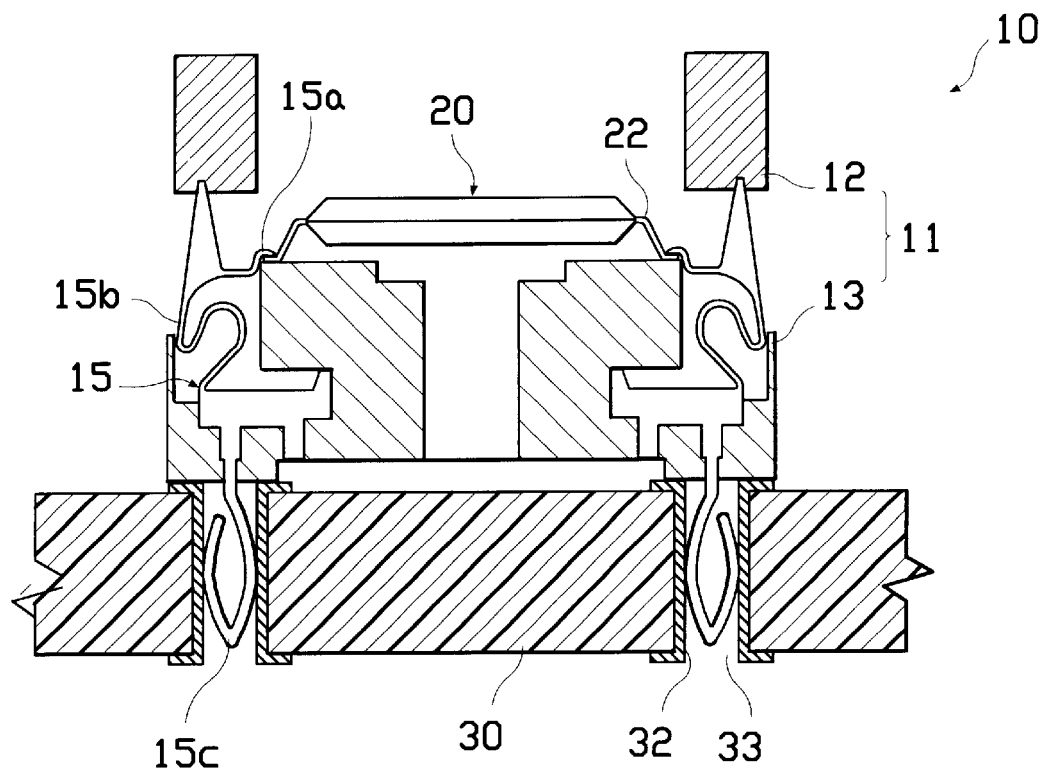
FIG. 5 is a cross-sectional view showing a connection method between the socket of FIG. 4 and a circuit board.
Figure 6:
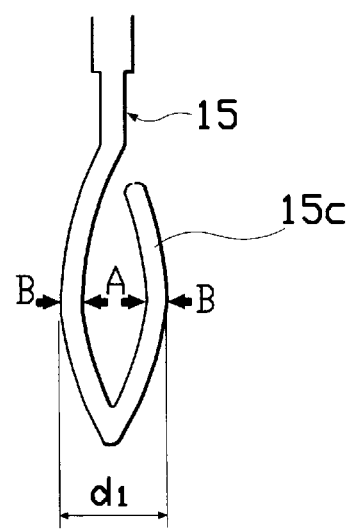
FIG. 6 is an enlarged view showing an outer connection portion of the socket lead of FIG. 4.

FIG. 4 is a perspective view showing an embodiment of a socket for testing a semiconductor integrated circuit device according to the present invention, and FIG. 5 is a cross-sectional view showing a connection between the socket of FIG. 4 and a circuit board 30. FIG. 6 is an enlarged view showing an outer connection portion of the socket lead of FIG. 4. This embodiment shows socket 10 and circuit board 30 for a burn-in test of a semiconductor integrated circuit device 20 in an SOP (Small Outline Package).

As shown in FIGS. 4 and 5, socket 10 comprises a socket body 11 and socket leads 15. Socket body 11 includes an upper body 12 and a lower body 13, and socket leads 15, which are integrated with lower body 13, includes an inner connection portion 15a, an elastic portion 15b and an outer connection portion 15c. In testing, semiconductor integrated circuit device 20 is placed on lower body 13 so that outer leads 22 of semiconductor integrated circuit device 20 contact respective inner connection portions 15a of socket leads 15. Upper body 12, which sits on lower body 13, has a cavity for semiconductor integrated circuit device 20 and is aligned with lower body 13 by guide bars 19. Upper body 12 holds semiconductor integrated circuit device 20 and secures the contact between outer leads 22 of semiconductor integrated circuit device 20 and respective inner connection portions 15a of socket leads 15. In particular, upper body 12 vertically moves up and down along guide bars 19 and applies pressure to elastic portions 15b of socket leads 15 so that inner connection portions 15a securely contact outer leads 22.

With reference to FIG. 5, socket lead 15 will be described hereinafter in detail. As mentioned above, each socket lead 15 comprises inner connection portion 15a, elastic portion 15b, and outer connection portion 15c. Inner connection portion 15a makes a contact with outer leads 22 of semiconductor integrated circuit device 20, and outer connection portion 15c makes a contact with circuit board 30. Elastic portions 15b are bent so that inner connection portion 15a contacts outer lead 22 when upper body 12 sits on lower body 13. That is, inner connection portions 15a contact outer leads 22 of semiconductor integrated circuit device 20 when upper body 12 of socket 10 moves down, and disconnect from outer leads 22 when upper body 12 moves up to release semiconductor integrated circuit device 20 from socket 10.

As shown in FIG. 6, outer connection portion 15c of this embodiment has a shape of elliptical hook for easy insertion and removal of outer connection portion 15c of socket lead 15 into and from a through hole 33 of circuit board 30. In addition, this shape provides elasticity to outer connection portion 15c of socket lead 15. The width d1, between the leftmost point and the rightmost point of outer connection portion 15c, is greater than the diameter (d2 in FIG. 7) of through hole 33. When socket lead 15 is inserted into through hole 33, outer connection portion 15c is squeezed in the direction of arrow "B" and pushes inner wall 32 of through hole 33 in the direction of arrow "A" to make a contact with through hole 33. Through hole 33 connects to a tester (not shown) by wiring for transferring electrical signals between the tester and circuit board 30. When socket lead 15 is removed from through hole 33, outer connection portion 15c recovers its initial shape.

Figure 7A:
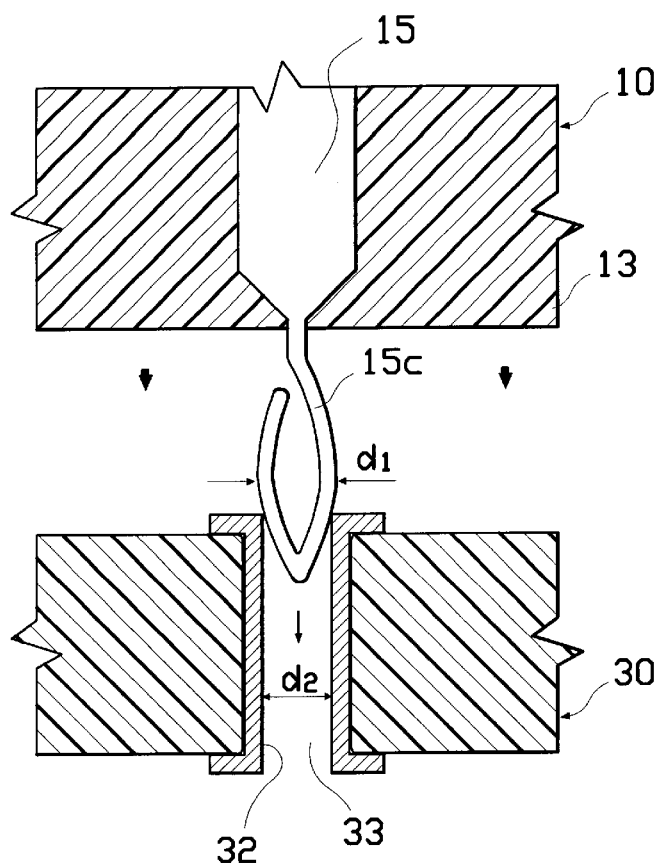
FIG. 7A is a schematic cross-sectional view showing the outer connection portion of the socket lead of FIG. 4 before insertion to the circuit board.
Figure 7B:
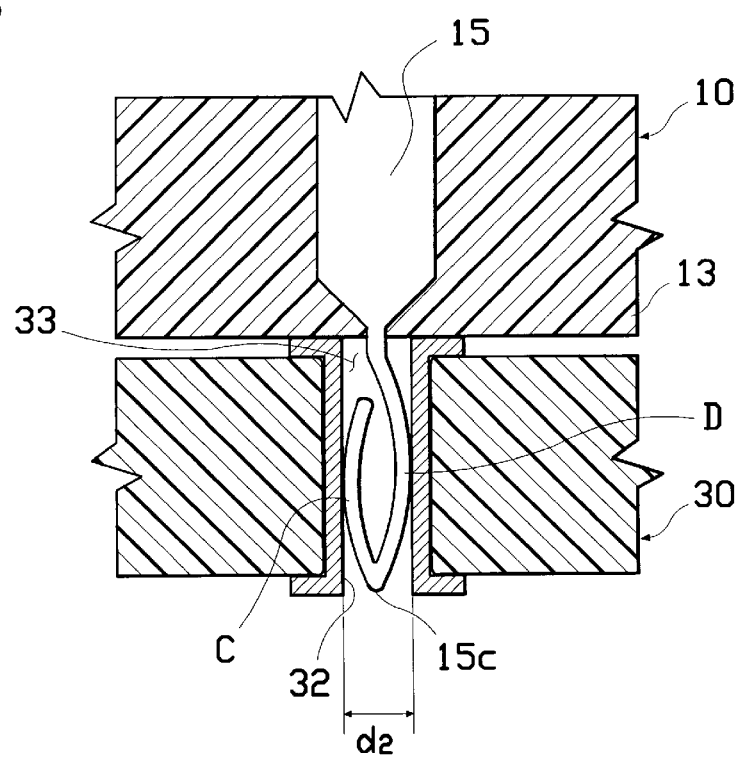
FIG. 7B is a schematic cross-sectional view showing the outer connection portion of the socket lead of FIG. 4 after insertion to the circuit board.

FIG. 7A and FIG. 7B are schematic cross-sectional views respectively showing socket lead 15 before and after being inserted into circuit board 30, respectively. With reference to FIG. 7a and FIG. 7b, the outer connection portion 15c of socket lead 15 will be described in detail hereinafter.

With reference to FIG. 7A, the appropriate width d1 of the central portion of the outer connection portion 15c is determined by inner diameter d2 of through hole 33 of circuit board 30. Generally, width d1 is greater than inner diameter d2 to such a degree that outer connection portion 15c maintains its elasticity without a plastic deformation of the elliptical hook shape of outer connection portion 15c after an extended use of socket 10. Preferably, 0.1 mm difference between width d1 and diameter d2 can give the elasticity without plastic deformation to outer connection portion 15c of socket lead 15. In one embodiment of the present invention, socket lead 15 is made of a conductive material such as copper or a copper alloy, and outer connection portion 15c is a loop of wire having a diameter of 0.27 mm. The loop has a width d1 of about 0.86 mm and a height of about 1.94 mm. Through hole 33 is circular with a diameter of about 0.75 mm and inner wall 32 is made of materials such as copper and gold that are conductive, abrasion-resistant, and oxidation-resistant.

In this embodiment, when outer connection portion 15c of socket lead 15 is in through hole 33 as shown in FIG. 7b, the elastic force from the compressed elliptical hook shape of outer connection portion 15c maintains the contact between inner wall 32 of through hole 33 and outer connection portion 15c. Herein, the location and size of the contact points between outer connection portion 15c and through hole 33 may be variously controlled by changing the shape and the degree of the bent portion of outer connection portion 15c.

Another advantage of the elliptical hook shape is a minimized friction between inner wall 32 of through hole 33 and outer connection portion 15c of socket lead 15 during insertion of socket lead 15 into through hole 33. Since the lower half of outer connection portion 15c has a "V" shape, it is possible to minimize the friction which is caused when inserting outer connection portion 15c into through hole 33 of circuit board 30. The "V" shape also helps align socket lead 15 with the associated through hole 33. In particular, if socket lead 15 is slightly misaligned, the point end of outer connection portion 15c will guide socket lead 15 into proper alignment during insertion. The upper half of outer connection portion 15c has an inverted "V" shape, which minimizes the friction when removing outer connection portion 15c from through hole 33 of circuit board 30.

The length of outer connection portion 15c can be such that outer connection portion 15c does not protrude below the lower surface of circuit board 30, when outer connection portion 15c is inserted in through hole 33 of circuit board 30. In the case of the conventional socket, in which outer connection portion of socket lead should be connected to a circuit board by soldering, the outer connection portion protrudes from through hole below the lower surface of the circuit board. However, in the present invention, since outer connection portion 15c does not have to protrude from through hole 33 outside the lower surface of circuit board 30, and the total height of circuit board 30 can be smaller than that of the circuit board for the conventional socket. Further, since the lower surface of circuit board 30 of the present invention is flat and even, the operation of an apparatus that loads and unloads the socket may be improved. Inner wall 32 of through hole 33 of circuit board 30 is made of conductive materials that are resistant to abrasion and oxidation, because inner wall 32 must withstand repeated insertion and removal of socket lead 15 into and from through hole 33. Preferably, a gold layer can be plated on the inner wall 32 of through hole 33, so that inner wall 32 can sustain its conductivity after an extended use of circuit board 30.

Figure 8:
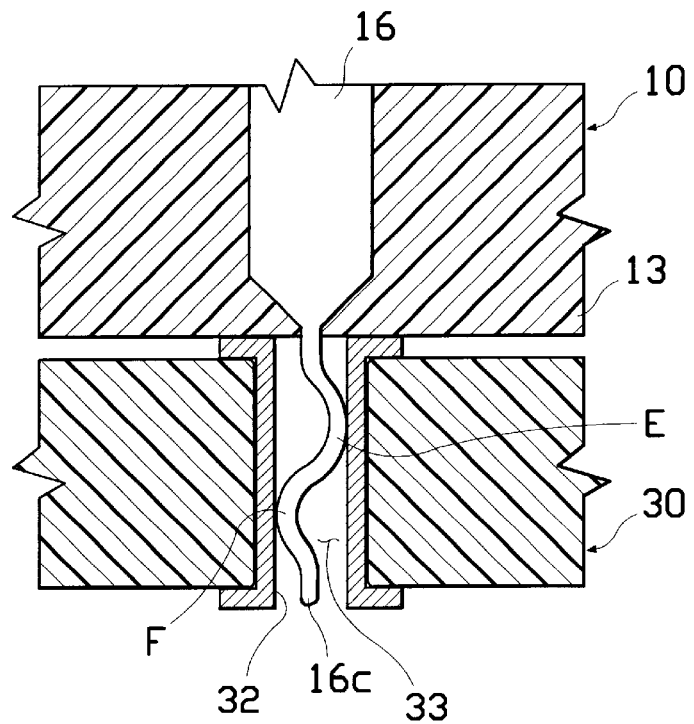
FIG. 8 is a cross-sectional view showing another embodiment of the outer connection portion of a socket lead according to the present invention.

FIG. 8 is a cross-sectional view showing another embodiment of an outer connection portion 16c of a socket lead 16 according to the present invention. In FIG. 8, outer connection portion 16c of socket lead 16 has an "S" shape. When socket 10 is loaded on circuit board 30, the end of outer connection portion 16c of socket lead 16 is inserted into through hole 33. The dimension of "S" is selected to provide an elastic contact between inner wall 32 and outer connection portion 16c. For example, the width between the rightmost point and the leftmost point of the "S" shape is greater than the inner diameter of through hole 33. When being inserted into through hole 33, outer connection portion 16c becomes somewhat squeezed and flat and pushes inner wall 32 of through hole 33 at points E and F, because "S" shaped outer connection portion 16c tries to expand against wall 32.

Next, an embodiment of a sub-circuit board according to the present invention will be described hereinafter.

Figure 9:
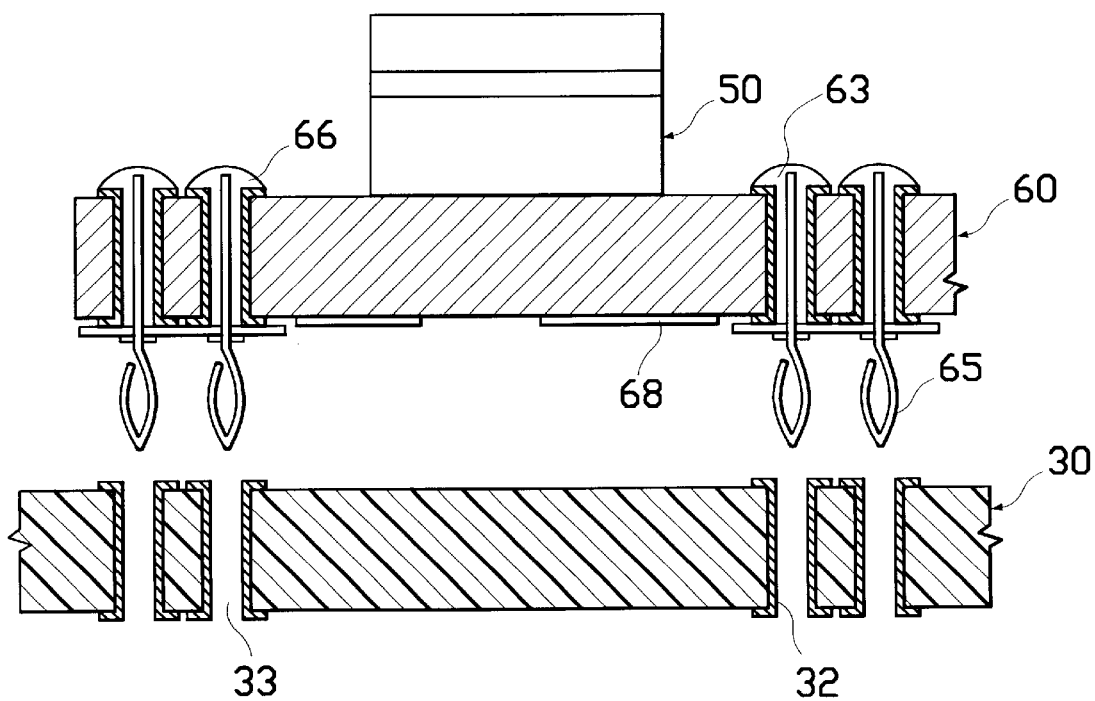
FIG. 9 is a cross-sectional view showing a connection method between a socket and a circuit board using a sub-circuit board according to the present invention.

FIG. 9 is a cross-sectional view showing another connection method between a socket 50 and a circuit board 30 using a sub-circuit board 60 according to the present invention. Sub-circuit board 60 according to the present invention electrically connects socket 50, especially for fine-pitch packages of semiconductor integrated circuit device, to circuit board 30.

In FIG. 9, sub-circuit board 60 includes a wiring pattern 68, through hole 63 and connection pins 65. Wiring pattern 68 electrically connects the outer connection portion (not shown) of socket 50 to respective through holes 63. Solder 66 fixes connection pins 65 to respective through holes 63. The outer connection portion of connection pin 65 is shaped for insertion into through hole 33 of circuit board 30 in the same manner as outer connection portion 15c in FIG. 5.

The present invention can be applied in various ways. First, the shape of the outer connection portion is not limited to an elliptical hook shape or an "S" shape. That is, the outer connection portion of the socket can be formed in any shape that gives elasticity to the outer connection portion of socket lead and contacts the inner wall of the associated through hole. Second, the socket and the circuit board according to the present invention are not limited to those which are used for burn-in test or electrical characteristics test of semiconductor integrated circuit devices. That is, the present invention may be applied to a socket and a circuit board wherever the socket is connected to the circuit board. Third, the shape of the inner connection portion of socket lead is not limited to the shape described above. The inner connection portion can have various shapes according to the type of the outline of semiconductor integrated circuit device, including but not limited to shapes for CSPs (Chip Scale Packages) and FPBGA (Fine Pitch Ball Grid Array) packages. In the cases of CSPs and FPBGA packages, since the solder balls of the packages are equivalent of the outer leads of conventional plastic packages, the inner connection portions of sockets contact the solder balls.

An experiment was carried out to evaluate the performance of the socket according to the embodiment in FIG. 5. The change of the width and the contact resistance of outer connection portions of socket leads were measured after repeated insertion and removal of the socket leads into and from the circuit board under a burn-in test condition. Initial widths of outer connection portion of four sockets were 0.86±0.03 mm, and the diameters of the through holes of circuit board were smaller than the width of the outer connection portion by about 0.1 mm. After the sockets were inserted and removed twenty times, the widths of the outer connection portions decreased by only about 0.017~0.029 mm. Accordingly, this result proves that the outer connection portion of the socket can maintain its initial dimension up to twenty times of insertion and removal of the socket.

Table 1 shows the change of contact resistance after repeated insertion and removal of six socket leads into and from the through holes of the circuit board.

TABLE 1

| times | 5 | 10 | 15 | 20 | 25 | 30 |
|---|---|---|---|---|---|---|
| average | 18.86 mΩ | 18.64 mΩ | 18.79 mΩ | 18.63 mΩ | 19.07 mΩ | 19.29 mΩ |

As shown in Table 1, the contact resistance change after thirty insertions and removals of the socket leads was only 0.43 mΩ. In other words, the quality of electrical connection between the socket and the circuit board was not seriously affected by repeated insertion and removal of the sockets into and from the through holes of the circuit board.

In summary, the present invention can eliminate the soldering process for fixing socket leads to test circuit boards and reduce the total cost for testing semiconductor integrated circuit devices due to the non-use of receptacles, compared with conventional connection methods described earlier. Moreover, the present invention makes the replacement of a socket on a circuit board easy.

Although embodiments of the present invention have been described in detail hereinabove, it should be clearly understood that many variations and/or modifications of the basic inventive concepts herein taught will still fall within the spirit and scope of the present invention as defined in the appended claims.

What is claimed is:

1. A socket for electrically connecting a semiconductor integrated circuit device to connection portions of a circuit board, the socket comprising:

a socket body; and a plurality of socket leads, each socket lead comprising;

an inner connection portion for contacting an external terminal of the semiconductor integrated circuit device; and an outer connection portion, which is integrated with the inner connection portion, for contacting an associated connection portion of the circuit board at a hole in the associated connection portion, the outer connection portion compressing elastically when inserted into the hole in the associated connection portion of the circuit board and providing frictional contact with multiple separated areas on an inner wall of the hole, the outer connection portion comprising an open-ended loop including a first portion and a second portion, the first portion being longer than the second portion, the second portion having a free end, the second portion and a section of the first portion being symmetrical about an axis of the outer connection portion, wherein when each outer connection portion is inserted into the hole in the associated connection portion of the circuit board, the free end of the second portion of the outer connection portion does not contact the first portion.

2. The socket of claim 1, wherein a lower portion of the outer connection portion is "V" shaped.

3. The socket of claim 1, wherein the outer connection portion has an elliptical hook shape.

4. The socket of claim 1, wherein a width of the widest portion of each outer connection portion is greater than a diameter of the hole in the associated connection portion of the circuit board.

5. The socket of claim 4, wherein the width of the widest portion of the outer connection portion is greater than the diameter of the hole in the associated connection portion of the circuit board by about 0.1 mm.

6. The socket of claim 1, wherein the circuit board is a test circuit board.

7. The socket of claim 1, wherein the inner connection portion electrically connects to the external terminal of the semiconductor integrated circuit device by the mechanical contact.

8. The socket of claim 1, wherein the external terminal of the semiconductor integrated circuit device is an outer lead of a semiconductor device package.

9. The socket of claim 1, wherein the external terminal of the semiconductor integrated circuit device is a solder ball of a semiconductor device package.

10. The socket of claim 1, wherein each outer connection portion is entirely inserted into the hole and is shaped to facilitate removal from the hole.

11. The socket of claim 1, wherein for each outer connection portion, the multiple separated areas that the outer connection portion contacts include areas on opposite sides of the hole of the associated connection portion of the circuit board.

12. A system for electrically testing a semiconductor integrated circuit device, the system comprising:
   a circuit board comprising:
      a plurality of connection portions, each connection portion including a hole; and
      wiring patterns which electrically connect respective holes to a tester; and
   a socket for connection with the circuit board, the socket including a plurality of socket leads, each socket lead including an end comprising an open-ended loop, the open-ended loop including a first portion and a second portion, the first portion being longer than the second portion, the second portion having a free end, the second portion and a section of the first portion being symmetrical about an axis of the end of the socket lead,
   wherein the circuit board connects to the socket by receiving the end of each socket lead within the hole of the associated connection portion, the end of each socket lead having a shape that provides elasticity and makes the socket lead contact multiple separated areas on an inner wall of the hole in the associated connection portion of the circuit board,
   and further wherein when the end of each socket lead is inserted into the hole of the associated connection portion of the circuit board, the free end of the second portion does not contact the first portion.

13. The system of claim 12, wherein the circuit board is a burn-in test circuit board.

14. The system of claim 12, wherein the end of each socket lead, which is received within the hole in the associated connection portion of the circuit board, is shaped to provide frictional contact with the inner wall of the hole.

15. The system of claim 12, wherein a lower portion of the end of each socket lead, which is received within the hole in the associated connection portion of the circuit board, is "V" shaped.

16. The system of claim 12, wherein the end of each socket lead, which is received within the hole in the associated connection portion of the circuit board, has an elliptical hook shape.

17. The system of claim 12, wherein a width of a widest portion of the end of each socket lead, which is received within the hole in the associated connection portion of the circuit board, is greater than a diameter of the through hole.

18. The system of claim 17, wherein the width of the widest portion of the end of each socket lead, which is received within the hole in the associated connection portion of the circuit board, is greater than the diameter of the through hole by about 0.1 mm.

19. The system of claim 12, wherein each socket lead is electrically connected by mechanical contact to one of a plurality of external terminals of the semiconductor integrated circuit device.

20. The system of claim 19, wherein the external terminals of the semiconductor integrated circuit device are outer leads of a semiconductor device package.

21. The system of claim 12, wherein the external terminals of the semiconductor integrated circuit device are solder balls of a semiconductor device package.

22. The system of claim 12, wherein the inner wall of the through hole is made of a conductive abrasion-resistant material.

23. The system of claim 22, wherein the conductive abrasion-resistant material is gold (Au).

24. The system of claim 12, wherein the inner wall of the hole is made of a conductive oxidation-resistant material.

25. The system of claim 24, wherein the conductive oxidation-resistant material is gold (Au).

26. The system of claim 12, wherein for each socket lead, the multiple separated areas that the socket lead contacts include areas on opposite sides of the inner wall of the hole in the associated connection portion of the circuit board.

27. A sub-circuit board for electrically connecting a socket, on which a semiconductor integrated circuit device is mounted, to a circuit board, the sub-circuit board comprising:
   a plurality of connection portions;
   wiring patterns that electrically connect the connection portions to a plurality of respective external terminals of the semiconductor integrated circuit device; and
   a plurality of connection leads, a first end of each connection lead being fixed to one of the connection portions and a second end of the connection lead being connected to the circuit board, the second end of each connection lead compressing elastically when inserted into a hole in an associated connection portion of the circuit board and providing frictional contact with multiple separated areas on an inner wall of the hole, the second end of each connection lead comprising an open-ended loop including a first portion and a second portion, the first portion being longer than the second portion, the second portion having a free end, the second portion and a section of the first portion being symmetrical about an axis of the connection lead, wherein when the second end of each connection lead is inserted into the hole in the associated connection portion of the circuit board, the free end of the second portion of the connection lead does not contact the first portion.

28. The sub-circuit board of claim 27, wherein a lower half portion of the second end of each connection lead is "V" shaped.

29. The sub-circuit board of claim 27, wherein the second end of each connection lead has an elliptical hook shape.

30. The sub-circuit board of claim 27, wherein a width of the widest portion of the second end of each connection lead is greater than a diameter of the hole of the associated connection portion of the circuit board.

31. The sub-circuit board of claim 20, wherein the width of the widest portion of the second end of each connection lead is greater than the diameter of the hole of the associated connection portion of the circuit board by about 0.1 mm.

32. The sub-circuit board of claim 27, wherein the circuit board is a test circuit board.

33. The sub-circuit board of claim 27, wherein the external terminals of the semiconductor integrated circuit device are outer leads of a semiconductor device package.

34. The sub-circuit board of claim 27, wherein the external terminals of the semiconductor integrated circuit device are solder balls of a semiconductor device package.

35. The sub-circuit board of claim 27, wherein each of the connection portions has the hole for receiving the second end of each connection lead.

36. The sub-circuit board of claim 27, wherein for each connection lead, the multiple separated areas that the connection lead contacts include areas on opposite sides of the inner wall of the hole in the associated connection portion of the circuit board.

37. A socket for electrically connecting a semiconductor integrated circuit device to connection portions of a circuit board, the socket comprising:
   a socket body; and
   a plurality of socket leads, each socket lead comprising;
      an inner connection portion for contacting an external terminal of the semiconductor integrated circuit device; and
      an outer connection portion, which is integrated with the inner connection portion, for contacting an associated connection portion of the circuit board at a hole in the associated connection portion, the outer connection portion compressing elastically when inserted into the hole in the associated connection portion of the circuit board and providing frictional contact with multiple separated areas on an inner wall of the hole, the outer connection portion comprising an open-ended loop including a first portion and a second portion, the first portion being longer than the second portion, the second portion having a free end, the second portion and a section of the first portion being symmetrical about an axis of the outer connection portion,
   wherein a central portion of the outer connection portion has greater width than that of a lower portion and an upper portion of the outer connection portion, and
   wherein when each outer connection portion is inserted into the hole in the associated connection portion of the circuit board, the free end of the second portion of the outer connection portion does not contact the first portion.

38. A system for electrically testing a semiconductor integrated circuit device, the system comprising:
   a circuit board comprising:
      a plurality of connection portions, each connection portion including a hole; and
      wiring patterns which electrically connect respective holes to a tester; and
   a socket for connection with the circuit board, the socket including a plurality of socket leads, each socket lead including an end comprising an open-ended loop, the open-ended loop including a first portion and a second portion, the first portion being longer than the second portion, the second portion having a free end, the second portion and a section of the first portion being symmetrical about an axis of the end of the socket lead,
   wherein the circuit board connects to the socket by receiving the end of each socket lead within the hole of the associated connection portion, the end of each socket lead having a shape that provides elasticity and makes the socket lead contact multiple separated areas on an inner wall of the hole in the associated connection portion of the circuit board,
   wherein a central portion of the end of each socket lead, which is received within the hole in the associated connection portion of the circuit board, has greater width than that of a lower portion and an upper portion of the end of the socket lead, which is received within the hole in the associated connection portion of the circuit board,
   and further wherein when the end of each socket lead is inserted into the hole of the associated connection portion of the circuit board, the free end of the second portion does not contact the first portion.

39. A sub-circuit board for electrically connecting a socket, on which a semiconductor integrated circuit device is mounted, to a circuit board, the sub-circuit board comprising:
   a plurality of connection portions;
   wiring patterns that electrically connect the connection portions to a plurality of respective external terminals of the semiconductor integrated circuit device; and
   a plurality of connection leads, a first end of each connection lead being fixed to one of the connection portions and a second end of the connection lead being connected to the circuit board, the second end of each connection lead compressing elastically when inserted into a hole in an associated connection portion of the circuit board and providing frictional contact with multiple separated areas on an inner wall of the hole, the second end of each connection lead comprising an open-ended loop including a first portion and a second portion, the first portion being longer than the second portion, the second portion having a free end, the second portion and a section of the first portion being symmetrical about an axis of the connection lead,
   wherein a central portion of the second end of each connection lead has a greater width than that of a lower portion and an upper portion of the end of connection lead, and
   wherein when the second end of each connection lead is inserted into the hole in the associated connection portion of the circuit board, the free end of the second portion of the connection lead does not contact the first portion.

* * * * *